(12) United States Patent
Jewett et al.

(10) Patent No.: US 6,812,878 B1
(45) Date of Patent: Nov. 2, 2004

(54) PER-ELEMENT RESAMPLING FOR A DIGITAL-TO-ANALOG CONVERTER

(75) Inventors: Robert E. Jewett, Redwood City, CA (US); Jacky Kin Chi Liu, Sunnyvale, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 10/427,578

(22) Filed: Apr. 30, 2003

(51) Int. Cl.[7] .............................................. H03M 1/66
(52) U.S. Cl. ..................................................... 341/144
(58) Field of Search ................................ 341/144, 150, 341/154

(56) References Cited

U.S. PATENT DOCUMENTS

| | | | | |
|---|---|---|---|---|
| 4,321,584 A | * | 3/1982 | McNutt ....................... | 341/150 |
| 4,369,432 A | * | 1/1983 | Mikami ....................... | 341/120 |
| 5,793,320 A | * | 8/1998 | Keum et al. ................. | 341/144 |
| 6,292,125 B1 | * | 9/2001 | Conroy ........................ | 341/153 |
| 6,583,742 B1 | * | 6/2003 | Hossack ...................... | 341/144 |
| 6,583,744 B2 | * | 6/2003 | Bright ......................... | 341/145 |

OTHER PUBLICATIONS

Alexander R. Bugeja, Bang–Sup Song, Patrick L. Rakers and Steven F. Gillig; "A 14b 100M Sample/s CMOS DAC Designed for Spectral Performance", pp. 148–149, ISSCC 1999 Digest of Technical Papers, Feb. 1999.

* cited by examiner

*Primary Examiner*—Peguy JeanPierre

(57) ABSTRACT

A digital-to-analog converter (DAC) and method for converting digital inputs into analog outputs utilizes resampling switches to regulate the transmission of partial analog signals between analog output elements and a summing circuit to reduce or eliminate "glitches" in the output signal. Each resampling switch may be individually connected to an analog output element to handle a fixed partial analog signal, e.g., a fixed current, generated by that analog output element. Consequently, the resampling switches can be used to reduce or eliminate the glitches in the output signal without introducing switch nonlinearity into the output signal by simultaneously transmitting the partial analog signals to the summing circuit using the resampling switches.

18 Claims, 4 Drawing Sheets

PER-ELEMENT RESAMPLING FOR A DIGITAL-TO-ANALOG CONVERTER

FIELD OF THE INVENTION

The invention relates generally to circuits, and more particularly to a digital-to-analog converter.

BACKGROUND OF THE INVENTION

Digital-to-analog converters (DACs) are circuits that receive digital inputs and produce analog outputs that are analog equivalents of the digital inputs in the form of currents or voltages. A typical DAC includes an encoder, a number of analog output elements and a summing circuit. The encoder receives a digital input, which is a digital value represented by a number of binary data bits, and then encodes the binary data bits into suitable drive signals to selectively activate the analog output elements. In response to the drive signals, the activated analog output elements generate partial analog signals. These partial analog signals are then combined by the summing circuit to produce an analog output, which is an analog representation of the digital input.

A problem that often arises during the operation of a DAC is the appearance of output errors called "glitches", which are mainly caused by mistiming of the partial analog signals at the output of the DAC. These glitches do not affect the final, settled value of the analog output for each digital input, and appear only during the transition from one digital input to the next. Therefore, the glitches corrupt the spectral content of the output signal, which presents an important concern for high-speed applications since the glitches can be misinterpreted as analog outputs.

One source of mistiming is different arrival times of the data bits of a digital input at the input of the encoder. However, this mistiming source can be easily minimized by using latches at the input of the encoder to synchronize the data bits. Another source of mistiming is differential logic delay between the input of the encoder and the output of the encoder. Again, this mistiming source can be minimized by adding latches at the output of the encoder with a carefully controlled clock. Still another source of mistiming is mismatch of path lengths between the encoder and the output analog elements and/or mismatch of path lengths between the output analog elements and the output of the DAC through the summing circuit. This last source of mistiming can be minimized by adding a switch between the summing circuit and the output of the DAC. The switch is used to pass the analog signal to the output only after the signal has settled to a final value. Thus, the portion of the analog signal with glitches can be blocked by to the use of the switch. This technique returns the output waveform to zero or some reference value during the problematic time, and thus, is commonly referred to as "Return to Zero" or RZ.

Using the RZ technique, the mismatched delays before the summing unit no longer affect the high-speed performance of the DAC, and the signal integrity becomes limited primarily by the linearity of the switch and the purity of a resampling clock used to operate the switch. Between these two limiting factors, the linearity of the switch is the main limiting factor. Switch nonlinearity can be due to the series resistance of the switch, which may have a nonlinear function with respect to the current passing through the switch. Furthermore, the switch nonlinearity may be due to other nonlinear parasitics, such as capacitance, which vary with current levels.

In view of this consideration, there is a need for a DAC and method for converting digital inputs into analog outputs such that glitches in the output signal are reduced or eliminated without introducing switch nonlinearity into the output signal.

SUMMARY OF THE INVENTION

A digital-to-analog converter (DAC) and method for converting digital inputs into analog outputs utilizes resampling switches to regulate the transmission of partial analog signals between analog output elements and a summing circuit to reduce or eliminate "glitches" in the output signal. Each resampling switch may be individually connected to an analog output element to handle a fixed partial analog signal, e.g., a fixed current, generated by that analog output element. Consequently, the resampling switches can be used to reduce or eliminate the glitches in the output signal without introducing switch nonlinearity into the output signal by simultaneously transmitting the partial analog signals to the summing circuit using the resampling switches.

A DAC in accordance with an embodiment of the invention includes a number of analog output elements, a number of switches and a summing circuit. The analog output elements are configured to selectively generate partial analog signals in response to a digital input. The summing circuit is configured to combine the partial analog signals to produce an analog output, which is an analog representation of the digital input. The switches are located between the analog output elements and the summing circuit to regulate the transmission of the partial analog signals between the analog output elements and the summing circuit. Each switch may be connected to a distinct analog output element to transmit the partial analog signal generated by that analog output element to the summing circuit.

A method for converting digital inputs into analog outputs in accordance with an embodiment of the invention includes receiving a digital input, generating partial analog signals in response to the digital input, regulating the transmission of the partial analog signals, and receiving and combining the partial analog signals to produce an analog output, which is an analog representation of the digital input.

Other aspects and advantages of the present invention will become apparent from the following detailed description, taken in conjunction with the accompanying drawings, illustrated by way of example of the principles of the invention.

DETAILED DESCRIPTION

Figure 1:
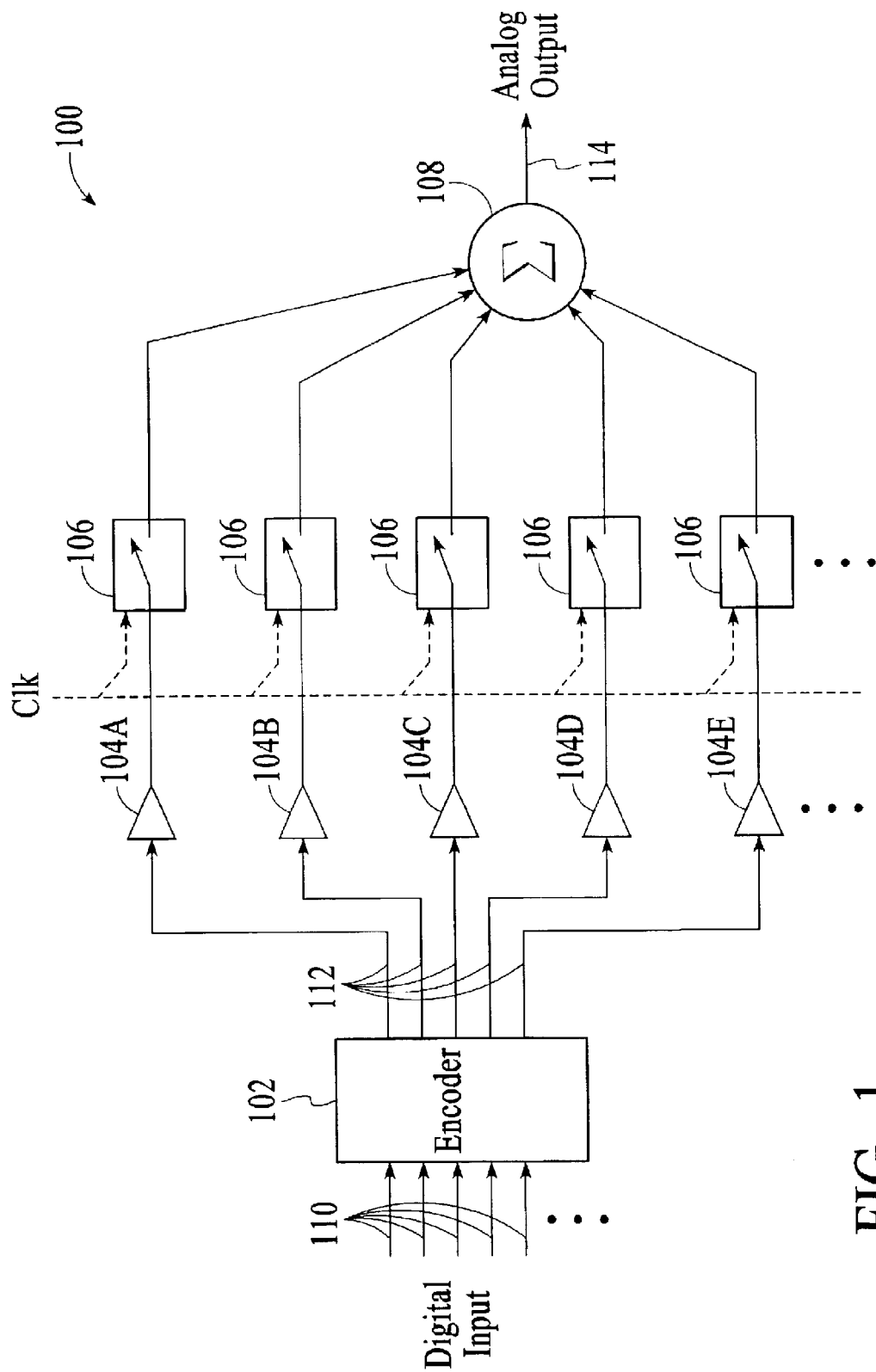
FIG. 1 is a diagram of a digital-to-analog converter (DAC) in accordance with an exemplary embodiment of the invention.

With reference to FIG. 1, a digital-to-analog converter (DAC) 100 in accordance with an exemplary embodiment of the invention is shown. The DAC 100 operates to produce analog outputs in response to received digital inputs. The magnitudes of the analog outputs correspond to the values represented by the respective digital inputs. Thus, the analog outputs are analog equivalents of the digital inputs. The DAC 100 includes an encoder 102, analog output elements 104 (only five analog output elements 104A, 104B, 104C, 104D and 104E are illustrated in FIG. 1), resampling switches 106 and a summing unit 108. As shown in FIG. 1, the resampling switches 106 are positioned between the analog output elements 104 and the summing unit 108. As described below, the use of these resampling switches 106 reduces or eliminates output errors known as "glitches" in the output signal of the DAC 100 without introducing switch nonlinearity, which is a common concern with conventional DACs using a "Return to Zero" (RZ) technique. Thus, the integrity of the output signal is not compromised by the use of the resampling switches 106 to reduce or eliminate glitches in the output signal.

The encoder 102 of the DAC 100 operates to translate N binary data bits of a received digital input into M encoded signals, where N and M are integers. The encoder 102 is connected to N input lines 110 to receive the N binary data bits. The encoder 102 is also connected to M control lines 112, which are individually connected to the analog output elements 104, to transmit the M encoded signals from the encoder to the analog output elements through the M control lines. The M encoded signals are drive signals that are used to selectively activate the analog output elements 104 in accordance with the value of the digital input so that an equivalent analog output can be produced using the analog signals generated by the activated analog output elements. Each encoded signal is either an enable signal to activate an analog output element or a disable signal to deactivate an analog output element. The encoder 102 may be any encoder that can be used in a DAC to translate binary data bits into encoded signals. As an example, the encoder 102 may be a standard thermometer encoder that uses a look-up table to translate binary data bits into thermometer-encoded signals.

The analog output elements 104 of the DAC 100 operate to generate one or more analog signals when the elements are selectively activated by the encoded signals from the encoder 102. The analog signals generated by the analog output elements 104 are partial analog signals that are subsequently combined to produce an analog output. As an example, the analog output elements 104 may be configured to generate the analog signals in the form of currents. As stated above, the analog output elements 104 are individually connected to the encoder 102 via the control lines 112 to receive encoded signals for a given digital input. That is, each analog output element 104 is connected to the encoder 102 by a separate control line 112 to receive one of the encoded signals for the given digital input. Consequently, depending on the encoded signal on a particular control line 112, the connected analog output element 104 is activated so that a partial analog signal is generated, or deactivated so that no signal is generated. In the exemplary embodiment, the analog output elements 104 are identical, and thus, each analog output element generates the same analog signal, e.g., the same current, when activated by an enable encoded signal. The output of each analog output element 104 is connected to the summing circuit 108 through one of the resampling switches 106.

The resampling witches 106 of the DAC 100 operate to simultaneously transmit the partial analog signals generated by the activated analog output elements 104 to the summing circuit 108 using a resampling clock signal Clk. Each resampling switch 106 is individually connected to a distinct analog output element 104 to transmit the partial analog signal generated by that analog output element. Thus, in the exemplary embodiment, the number of resampling switches is equal to the number of analog output elements 104. The Clk signal controls the state of the resampling switches 106 to simultaneously close or open all the resampling switches for a given period. Thus, the resampling switches 106 regulate the transmission of the partial analog signals between the activated analog output elements 104 to the summing circuit 108. Using the timing of the Clk signal, the resampling switches 106 perform a similar function to a conventional RZ switch. The resampling switches 106 can be operated to allow partial analog signals, e.g., currents, to settle to the final value before being transmitted to the summing circuit 108. Consequently, the portions of the analog signals that contribute to glitches in the final output signal of the DAC 100 are effectively removed by the use of the resampling switches 106. In the exemplary embodiment, the resampling switches 106 are identical, as is the case for the analog output elements 104. Thus, when closed, each resampling switch 106 connected to an activated analog output element 104 passes the analog signal generated by that analog output element. Since each resampling switch 106 handles a fixed analog signal, e.g., a fixed current, the concern with respect to switch nonlinearity, which is a significant concern in using a conventional RZ switch, is resolved by using the resampling switches to simultaneously transmit equivalent analog signals from the analog output elements 104 to the summing circuit 108.

In other embodiments, the DAC 100 may include fewer resampling switches 106 than the number of analog output elements 104. In these embodiments, the outputs of two or more analog output elements 104 may be connected to each other such that partial analog signals from the analog output elements are combined. The resulting output is also connected to the input of one of the resampling switches 106. Thus, each resampling switch 106 can be connected to transmit a combined analog signal from multiple analog output elements 104. The number of resampling switches 106 included in the DAC 100 may be any number less than the total number of analog output elements 104 included in the DAC.

The summing circuit 108 of the DAC 100 operates to combine the partial analog signals from the analog output elements 104, which are simultaneously transmitted through the resampling switches 106, to produce an analog output on an output terminal 114, which is an analog equivalent of the received digital input. The summing circuit 108 may be configured to produce the analog output using one of various signal combining schemes that linearly add the analog signals from the analog output elements 104. As an example, the summing circuit 108 may use a standard segmented current summing scheme in which some of the currents (i.e., the partial analog signals) from the analog output elements 104 are directly applied to the output terminal 114 to provide most significant bit signals of the analog output, while other currents from the analog output elements are first scaled using an R-2R structure before being applied to the output terminal to provide binary-scaled least significant bit signals of the analog output. Other current summing schemes, which may be used by the summing circuit 108, include a straight binary-weighted R-2R scheme and a single output load resistor scheme in which the currents from the analog output elements 104 are applied to a single output load resistor. The output terminal 114 of the DAC 100 may be connected to a current-to-voltage converter (not shown) to change the analog output from a current to a voltage.

The linearity of analog outputs produced by the DAC 100 does not depend on the basic series linearity of the resampling switches 106. For example, suppose the output current of each resampling switch 106 has a nonlinear relationship to the input current, defined by a function such as $I_{out}=I_{in}+A*I_{in}^2$, where $I_{out}$ is the output current of the resampling switch, $I_{in}$ is the input current of the resampling switch and A is a constant. This will result in only two possible values for the output current of each resampling switch 106, $I_0$ for the encoded signal of "0" (disable) or $I_1$ for the encoded signal of "1" (enable). After being combined at the summing circuit 108, if there are n 1's present in the control lines 112, the signal will be $n*I_1+(M-n)*I_0$. This is a linear function of n, although the signal may include gain and offset errors.

Figure 2:
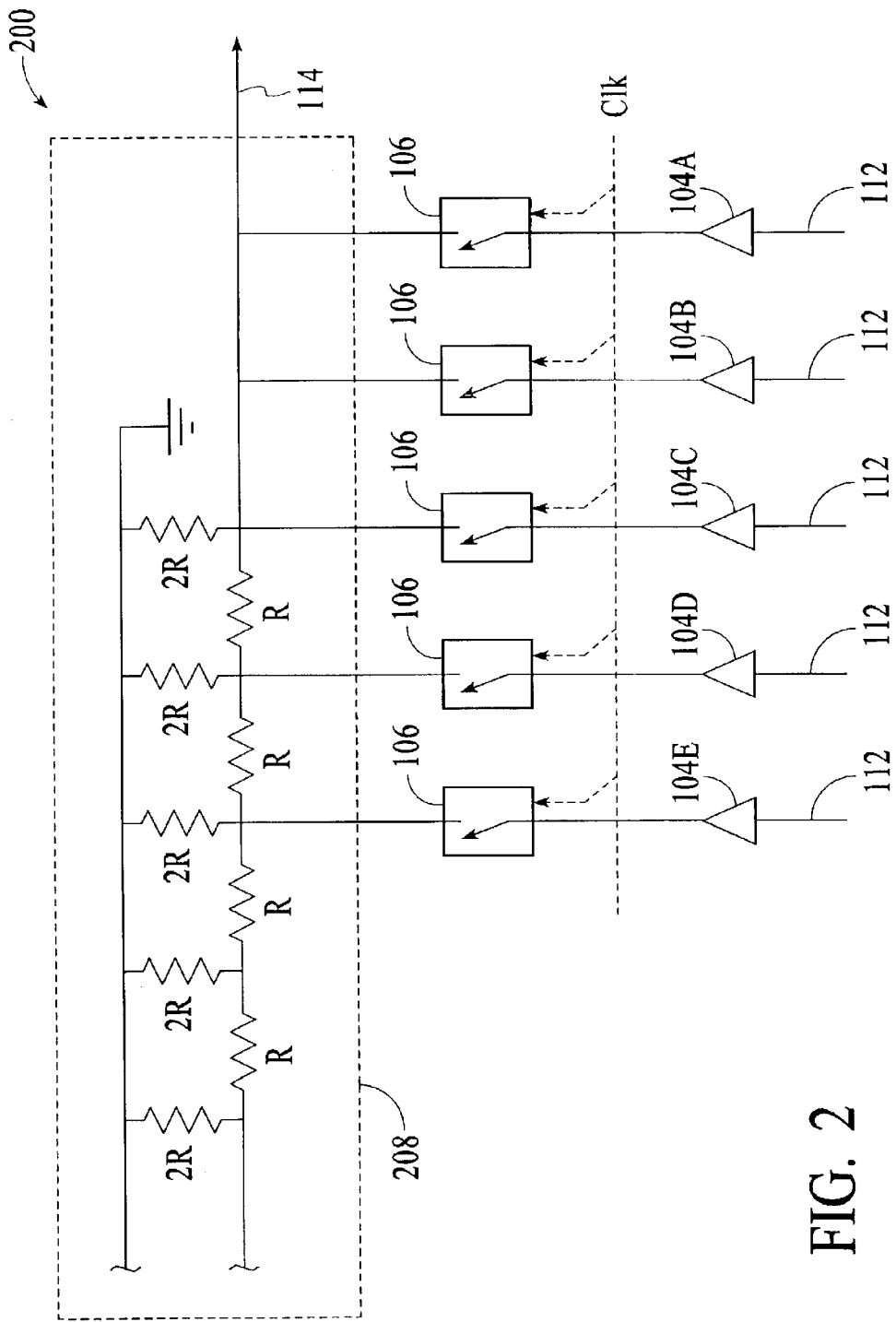
FIG. 2 is a partial diagram of a DAC configured in a standard segmented DAC architecture in accordance with an embodiment of the invention.

Turning now to FIG. 2, part of a DAC 200 configured in a standard segmented DAC architecture in accordance with an embodiment of the invention is shown. Same reference numerals of FIG. 1 are used to identify similar elements in FIG. 2. An encoder for the DAC 200 is not shown in FIG. 2. The DAC 200 includes an R-2R output summing circuit 208, which is electrically connected to the analog output elements 104A, 104B, 104C, 104D and 104E via the resampling switches 106. In this embodiment, each analog output element generates the same analog signal, e.g., the same current. However, depending on the connections of the analog output elements to the R-2R output summing circuit 208, the entire analog signal or a scaled portion of the analog signal from a particular analog output element may be transmitted to the output terminal 114 to produce the resulting analog output. For analog output elements that are directly connected to the output terminal 114, e.g., the analog output elements 104A, 104B and 104C, the entire analog signals generated by these analog output elements are transmitted to the output terminal 114. For analog output elements that are connected to the output terminal 114 via one or more R and 2R resistors, e.g., the analog output elements 104D and 104E, binary-scaled portions of the analog signals generated by these analog output elements are transmitted to the output terminal 114. The analog output elements that are directly connected to the output terminal 114 can be considered as providing most significant bit (MSB) signals of an analog output, which are large fixed analog signals, while the analog output elements that are connected to the output terminal 114 via one or more R and 2R resistors can be considered as providing least significant bit (LSB) signals of the analog output, which are smaller scaled signals. The MSB signals and the LSB signals are combined at the output terminal 114 to produce the analog output. For ease of illustration, only three analog output elements 104A, 104B and 104C for generating the MSB signals and two analog output elements 104D and 104E for generating LSB signals are shown in FIG. 2. However, the number of analog output elements included in the DAC 200 to generate the required MSB and LSB signals to produce analog outputs can be significantly larger. As an example, the DAC 200 may include thirty-two (32) analog output elements to generate the MSB signals and nine (9) analog output elements to generate the LSB signals for a 14-bit digital-to-analog conversion.

In order to simplify the description, the DACs 100 and 200 of FIGS. 1 and 2 have been illustrated and described as being configured to generate a single analog output for a given digital input. However, the DACs 100 and 200 can be modified to generate a pair of differential analog outputs for a given digital input, which may be desired for certain applications.

Figure 3:
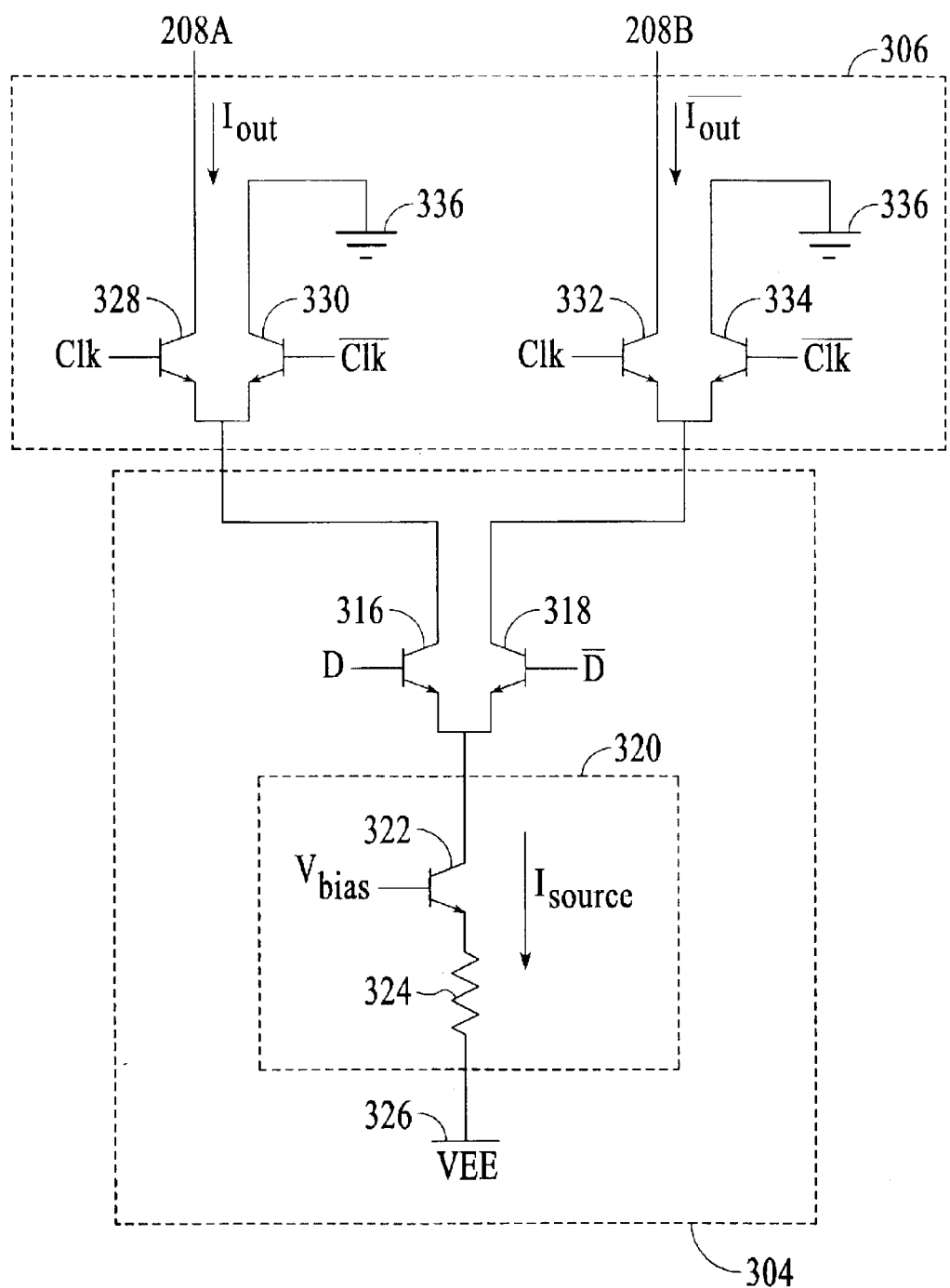
FIG. 3 is a circuit diagram of an analog output element and a resampling switch, which can be use in the DAC of FIG. 1 or 2, in accordance with an exemplary implementation.

In FIG. 3, an analog output element 304 and a resampling switch 306 in accordance with an exemplary differential implementation are shown. The analog output element 304 and the resampling switch 306 can be used in the DAC 100 of FIG. 1 or the DAC 200 of FIG. 2. The analog output element 304 and the resampling switch 306 are configured to generate differential analog signals, $I_{out}$ and $\overline{I_{out}}$, using encoded signals, D and $\overline{D}$, and resampling clock signals, Clk and $\overline{Clk}$. The analog output element 304 includes differentially connected bipolar transistors 316 and 318 and a current source 320. The emitters of the differentially connected transistors 316 and 318 are connected to the current source 320. The base of the differentially connected transistor 316 is connected to receive the encoded signal D, while the base of the differentially connected transistor 318 is connected to receive the encoded signal $\overline{D}$. The current source 320 includes a bipolar transistor 322 and a resistor 324, which are connected in series to a low voltage terminal 326, e.g., −3.3V. The base of the bipolar transistor 322 is connected to receive a bias voltage $V_{bias}$, which controls the current conducted through the transistor. The bipolar transistor 322 and the resistor 324 of the current source 320 operate to conduct a fixed current $I_{source}$ that defines the values of $I_{out}$ and $\overline{I_{out}}$.

The differentially connected transistors 316 and 318 of the analog output element 304 are connected to the resampling switch 306, which includes bipolar resampling transistors 328, 330, 332 and 334. The emitters of the resampling transistors 328 and 330 are connected to the collector of the differentially connected transistor 316 of the analog output element 304, while the emitters of the resampling transistors 332 and 334 are connected to the collector of the other differentially connected transistor 318 of the analog output element. The collector of the resampling transistor 328 is also connected to a summing circuit 208A (not shown) to transmit the differential analog signal $I_{out}$. Similarly, the collector of the resampling transistor 332 is connected to another summing circuit 208B (not shown) to transmit the differential analog signal $\overline{I_{out}}$. The summing circuits 208A and 208B may be identical to the summing circuit 208 of FIG. 2. The summing circuits 208A and 208B are configured to receive differential analog signals from analog output elements to produce differential analog outputs. The resampling transistors 328 and 332 are controlled by the clock signal Clk, which is applied to the bases of the transistors 328 and 332. In contrast, the resampling transistors 330 and 334 are controlled by the clock signal $\overline{Clk}$, which is applied to the bases of the transistors 330 and 334. The collectors of the resampling transistors 330 and 334 are connected to a voltage terminal 336, e.g., ground, to discard currents from the resampling transistors 330 and 334, which may be corrupted by glitchy transitions when the clock signal $\overline{Clk}$ is high.

Although the transistors of the analog output element 304 and the resampling switch 306 are illustrated and described as being bipolar transistors, other types of transistors may instead be used. As an example, the transistors of the analog output element 304 and the resampling switch 306 can be metal oxide semiconductor (MOS) transistors. Alternatively, these transistors may be a mixture of different types of transistors.

Figure 4:
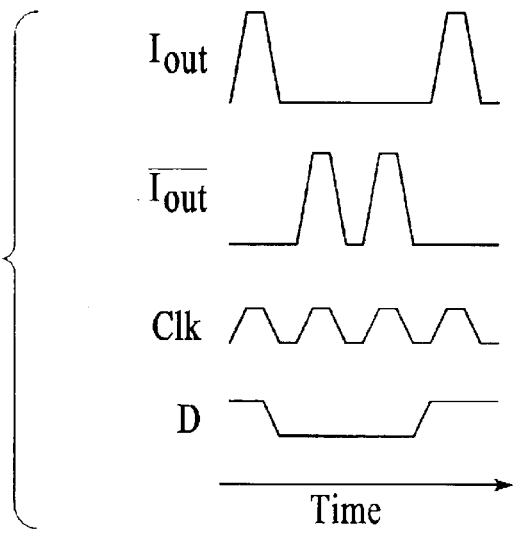
FIG. 4 is a timing diagram of the analog output element and the resampling switch of FIG.3.

Turning now to FIG. 4, a timing diagram for the signals, $I_{out}$, $\overline{I_{out}}$, Clk and D, are shown. These signals are examples to illustrate the operation of the analog output element 304 and the corresponding resampling switch 306. As shown in the timing diagram, a high differential signal $I_{out}$ is generated when both the clock signal Clk and the encoded signal D are high, while a high differential signal $\overline{I_{out}}$ is generated when the clock signal Clk is high and the encoded signal D is low. As further shown in the timing diagram, the clock signal Clk is temporally offset from the encoded signal D so that the encoded signal D changes only while the clock signal Clk is low. Thus, the differential analog signals, $I_{out}$ and $\overline{I_{out}}$ have a chance to settle before the clock signal Clk again rises, which results in clean output pulses.

Figure 5:
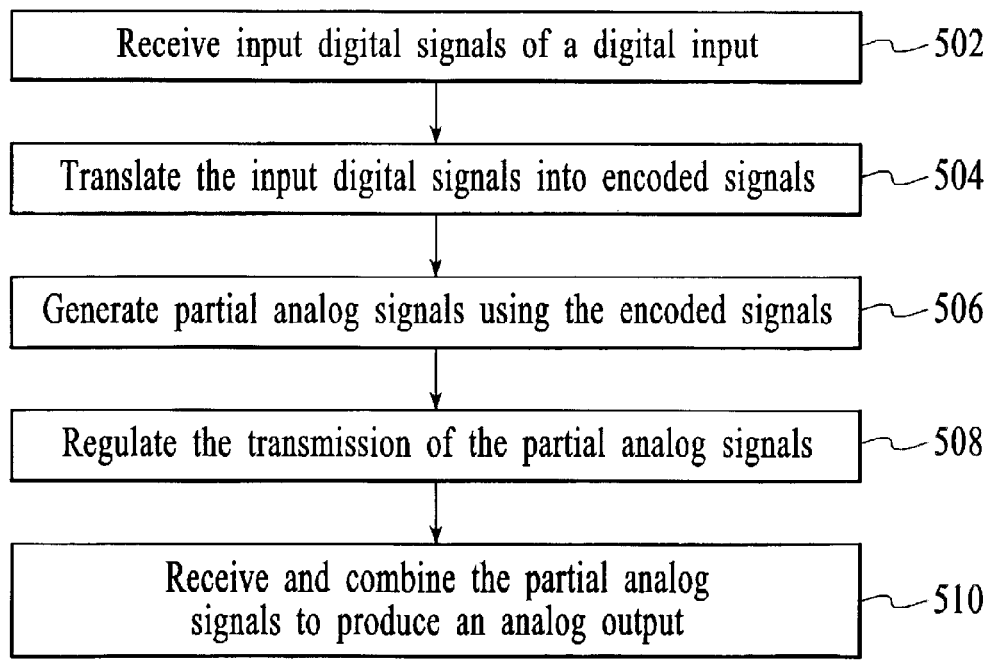
FIG. 5 is a process flow diagram of a method for converting digital inputs into analog outputs in accordance with an exemplary embodiment of the invention.

A method for converting digital inputs into analog outputs in accordance with an exemplary embodiment is described with reference to a flow diagram of FIG. 5. At block 502, input digital signals of a digital input are received. The input digital signals of the digital input represent a value. Next, at block 504, the input digital signals are translated into encoded signals. As an example, the encoded signals may be thermometer-encoded signals. At block 506, partial analog signals are generated using the encoded signals. The partial analog signals may be generated by selectively activating analog output elements using the encoded signals as drive signals. Next, at block 508, the transmission of the partial analog signals is regulated. As an example, a number of resampling switches may be used to regulate the transmission of the partial analog signals by simultaneously closing and opening the resampling switches using a clock signal to simultaneously transmit the partial analog signals, which can reduce or eliminate glitches in the resulting output signal without introducing switch nonlinearity. The clock signal should be temporally offset from the transitions in the input digital signal so that relevant electrical signals have a chance to settle when the switches are open. At block 510, the partial analog signals are received and combined using a predefined scheme to produce an analog output, which is an analog representation of the digital input. As an example, the partial analog signals may be combined using a standard segmented combining scheme using an R-2R structure.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A digital-to-analog converter comprising:
   analog output elements configured to selectively generate partial analog signals in response to a digital input;
   a summing circuit connected to said analog output elements, said summing circuit being configured to combine said partial analog signals to produce an analog output; and
   switches connected between said analog output elements and said summing circuit, said switches being configured to regulate transmission of said partial analog signals from said analog output elements to said summing circuit,
   wherein at least one of said analog output elements includes a transistor and a current source that are connected in series with a particular switch of said switches and a voltage terminal.

2. The converter of claim 1 wherein each of said analog output elements is connected to said summing circuit through a different switch of said switches.

3. The converter of claim 2 wherein said switches are connected to receive a clock signal to simultaneously transmit said partial analog signals from said analog output elements to said summing circuit.

4. The converter of claim 1 wherein said analog output elements are configured to generate equivalent signals.

5. The converter of claim 1 wherein said particular switch includes first and second transistors that are connected to said transistor, said first transistor being further connected to said summing circuit, said second transistor being further connected to a second voltage terminal.

6. The converter of claim 1 wherein said summing circuit includes an R-2R circuit.

7. The converter of claim 6 wherein said analog output elements are connected to said summing circuit such that some of said partial analog signals are used to generate binary-scaled signals to produce said analog output.

8. A digital-to-analog converter comprising:
   analog output elements configured to selectively generate equivalent partial analog signals in response to a digital input, wherein said equivalent partial analog signals are equivalent to each other;
   a summing circuit connected to said analog output elements, said summing circuit being configured to combine said equivalent partial analog signals to produce an analog output; and
   switches positioned between said analog output elements and said summing circuit, each of said switches being connected to a distinct analog output element from said analog output elements, said switches being configured to regulate transmission of said equivalent partial analog signals from said analog output elements to said summing circuit.

9. The converter of claim 8 wherein said switches are connected to receive a clock signal to simultaneously transmit said equivalent partial analog signals from said analog output elements to said summing circuit.

10. The converter of claim 8 wherein each of said analog output elements includes a transistor and a current source that are connected in series with a particular switch of said switches and a voltage terminal.

11. The converter of claim 10 wherein said particular switch includes first and second transistors that are connected to said transistor, said first transistor being further connected to said summing circuit, said second transistor being further connected to a second voltage terminal.

12. The converter of claim 8 wherein said summing circuit includes an R-2R circuit.

13. A digital-to-analog conversion method comprising:
   receiving a digital input;
   generating equivalent partial analog signals in response to said digital input, wherein said equivalent partial analog signals are equivalent to each other;
   regulating transmission of said equivalent partial analog signals; and
   receiving and combining said equivalent partial analog signals to produce an analog output, said analog output being an analog representation of said digital input.

14. The method of claim 13 wherein said regulating of said transmission of said equivalent partial analog signals includes simultaneously transmitting said equivalent partial analog signals using a clock signal.

15. The method of claim 13 wherein said regulating of said transmission of said equivalent partial analog signals includes activating a plurality of switches to transmit said equivalent partial analog signals.

16. The method of claim 15 wherein said regulating of said transmission of said equivalent partial analog signals includes combining at least two of said equivalent partial analog signals before transmitting said at least two of said equivalent partial analog signals through one of said switches.

17. The method of claim 15 wherein said activating of said plurality of switches includes simultaneously activating said plurality of switches to simultaneously transmit said equivalent partial analog signals.

18. The method of claim 13 wherein said combining of said equivalent partial analog signals includes generating binary-scaled signals from some of said equivalent partial analog signals to produce said analog output.

* * * * *